(12) United States Patent
Pujol et al.

(10) Patent No.: US 7,274,252 B2
(45) Date of Patent: Sep. 25, 2007

(54) POWER AMPLIFICATION CIRCUIT AND OPERATIONAL AMPLIFIER INCORPORATING SAID CIRCUIT

(75) Inventors: Alexandre Pujol, Grenoble (FR); Colette Morche, Meylan (FR)

(73) Assignee: STMicroelectronics SA, Montrouge (FR)

( * ) Notice: Subject to any disclaimer, the term of this patent is extended or adjusted under 35 U.S.C. 154(b) by 116 days.

(21) Appl. No.: 11/066,604

(22) Filed: Feb. 25, 2005

(65) Prior Publication Data
US 2005/0218944 A1    Oct. 6, 2005

(30) Foreign Application Priority Data
Feb. 25, 2004    (FR)    ................... 04 01903

(51) Int. Cl.
*G06G 7/26*    (2006.01)
(52) U.S. Cl. ...................................... 327/563; 327/560
(58) Field of Classification Search ......... 327/560–563
See application file for complete search history.

(56) References Cited
U.S. PATENT DOCUMENTS
4,059,808 A    11/1977    Sakamoto et al.
4,780,689 A    10/1988    Saller et al.
4,833,424 A    5/1989    Wright
4,959,622 A    9/1990    Kearney
5,028,881 A *    7/1991    Jackson ...................... 330/253
5,049,653 A    9/1991    Smith et al.
5,179,355 A    1/1993    Harvey
6,278,326 B1 *    8/2001    Murray et al. .............. 330/288
6,535,063 B1    3/2003    Gibson et al.

* cited by examiner

*Primary Examiner*—Kenneth B. Wells (57) ABSTRACT

A power amplifier circuit comprising first and second modules, a current source and a push-pull module. The push-pull module comprises two intermediate transistors and two output transistors. The circuit also comprises third and fourth modules, operating in current mirror mode. Inputs of the third module are respectively connected to one main electrode of one of the intermediate transistors and to a node internal to the first module. Outputs of the fourth module are respectively connected to a main electrode of the other intermediate transistor and to a node internal to the second module. The circuit is designed to form a power output stage of an operational amplifier.

20 Claims, 5 Drawing Sheets

POWER AMPLIFICATION CIRCUIT AND OPERATIONAL AMPLIFIER INCORPORATING SAID CIRCUIT

CROSS-REFERENCE TO RELATED APPLICATIONS

The present application is related to French Patent Application No. 04/01903, filed Feb. 25, 2004, entitled "POWER AMPLIFICATION CIRCUIT AND OPERATIONAL AMPLIFIER INCORPORATING SAID CIRCUIT". French Patent Application No. 04/01903 is assigned to the assignee of the present application and is hereby incorporated by reference into the present disclosure as if fully set forth herein. The present application hereby claims priority under 35 U.S.C. §119(a) to French Patent Application No. 04/01903.

TECHNICAL FIELD OF THE INVENTION

The present invention relates to a power amplification circuit and an operational amplifier incorporating such a circuit. The power amplification circuit is used in the operational amplifier as power output stage, or output buffer.

BACKGROUND OF THE INVENTION

A high input impedance, a low output impedance and wide output current and output voltage dynamic ranges are some of the desired features for a power amplification circuit.

Figure 1:
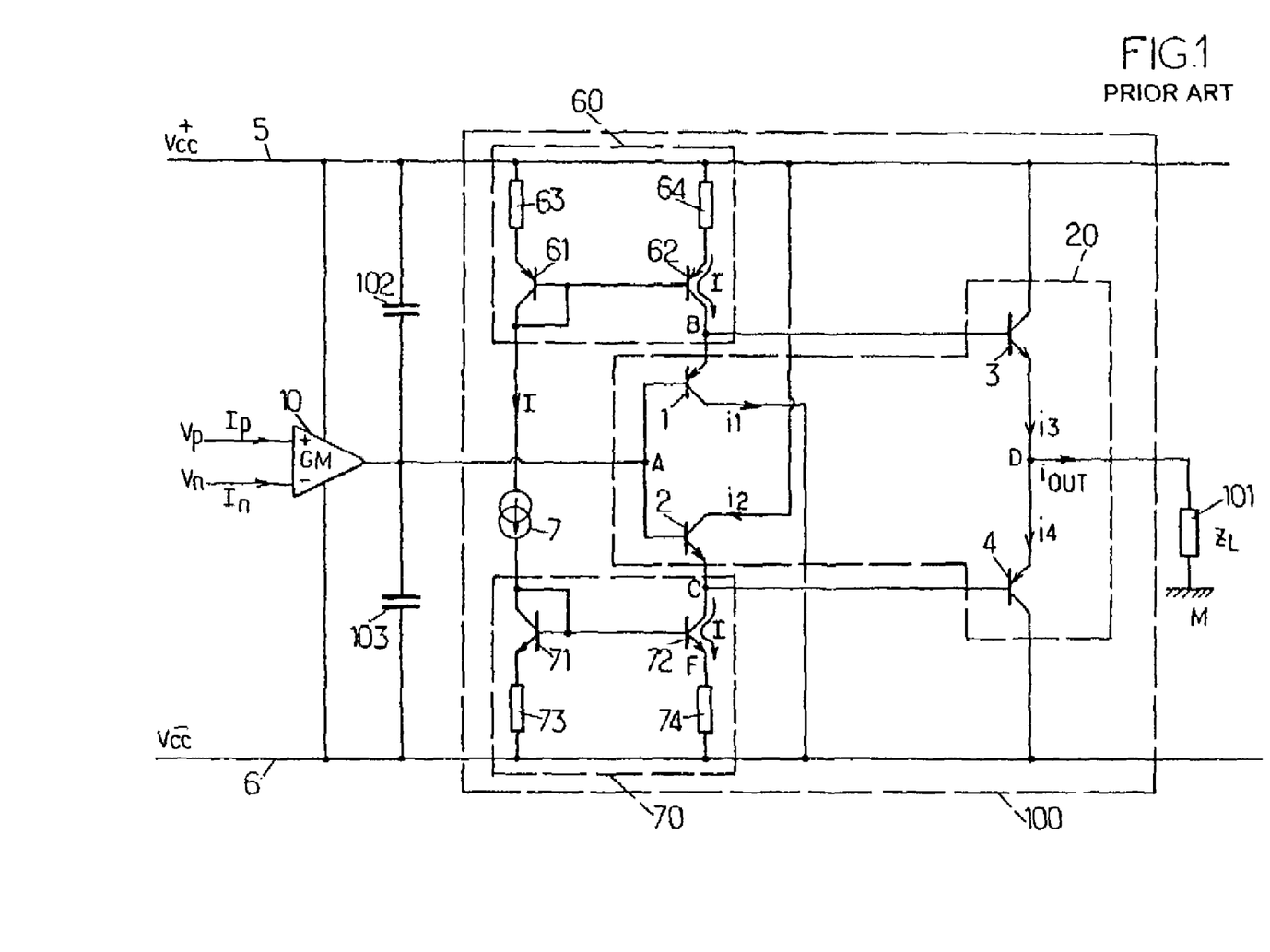
FIG. 1, already described above, is a circuit diagram of a known operational amplifier.

FIG. 1 is a circuit diagram of a differential operational amplifier known in the prior art. Such an operational amplifier comprises two cascaded amplification stages. An input stage, designated by GM, is formed by a differential transconductance amplifier 10, receiving currents Ip and In, corresponding to input electric potentials Vp and Vn, on two positive and negative inputs, respectively. The transconductance amplifier 10 is connected between two voltage supply terminals, a positive supply terminal 5 and a negative supply terminal 6, respectively, referenced with respect to an electric ground terminal M. Respective electric potentials $V_{CC}^+$ and $V_{CC}^-$ of the supply terminals 5 and 6 can, for example, be +2.5 V and −2.5 V. The currents Ip and In are of the order of a few microamps in absolute value. The input electric potentials Vp and Vn can vary between $V_{CC}^-$ and $V_{CC}^+$; they form the input signals of the operational amplifier.

The output of the transconductance amplifier 10 forms the output of the input stage. It is connected to a node A that forms an input of the power output stage 100. Capacitors 102 and 103 connect the node A to the supply terminals 5 and 6, respectively. These stabilize the operation of the operational amplifier.

A node D forms an output of the power output stage 100 and is also an output of the operational amplifier. A load 101, of value $Z_L$, is connected between the node D and the ground terminal M. The load 101 is usually equivalent to a resistor connected in parallel with a capacitor (not shown) $Z_L$ can, for example, have a modulus equal to 100 ohms.

The power amplification circuit that forms the power output stage 100 is designated in the following description as circuit 100. It comprises two circuit modules 60 and 70. The module 60 comprises two pnp-type bipolar transistors 61 and 62, preferably identical to each other. The emitters of the transistors 61 and 62 are connected to the supply terminal 5 by identical resistors 63 and 64, respectively, with a common value R. R can, for example, be equal to 1 kilo-ohm. The bases of the transistors 61 and 62 are connected to each other, and also to the collector of the transistor 61. In other words, the transistor 61 is configured as a diode. The module 60 thus configured forms a well-known Widlar current source with outflowing currents. This operates as a current mirror: the currents flowing from the collectors of the transistors 61 and 62 are equal to each other.

The module 70 is also a Widlar current source, but with inflowing currents. It has a complementary structure to that of the module 60. The module 70 thus comprises two npn-type bipolar transistors 71 and 72, preferably identical to each other. Each of these transistors has an emitter connected to the supply terminal 6 by a resistor 73 and 74, respectively. The resistors 73 and 74 have the same common value, which can also be the value R, but not necessarily. The respective bases of the transistors 71 and 72 are connected to each other and, in addition, to the collector of the transistor 71.

A current source 7 is connected between the collectors of the transistors 61 and 71. The positive terminal of the source 7 is connected to the collector of the transistor 71, and the negative terminal of the source 7 is connected to the collector of the transistor 61. The intensity I of the current delivered by the source 7 may, for example, be 200 microamps.

The circuit 100 also comprises a module 20 of the 'push-pull' type. The module 20 comprises two intermediate bipolar transistors 1 and 2, pnp and npn respectively. The transistors 1 and 2 are preferably matched, in other words they have identical structures but have electrical doping types that are reversed with respect to each other. The bases of the transistors 1 and 2 are connected to each other and to the node A. The emitters of the transistors 1 and 2 are respectively connected to the collectors of the transistors 62 and 72, at a node B and at a node C, respectively. Output transistors 3 and 4, of npn and pnp type respectively, and preferably matched, have their bases connected, respectively, to the nodes B and C. The emitters of the transistors 3 and 4 are connected to each other and to the node D. The collectors of the transistors 3 and 4 are connected to the supply terminals 5 and 6, respectively.

According to the known configuration of the circuit 100, the collector of the intermediate transistor 1 is directly connected to the supply terminal 6, and the collector of the intermediate transistor 2 is directly connected to the supply terminal 5.

When the difference Vp−Vn between the input electric potentials Vp and Vn is positive and progressively increasing, the electric potential of the node A, denoted $V_A$, is also positive and varies according to an amplification characteristic of the transconductance amplifier 10. In practice, $V_A$ is equal to a saturation value that depends on $V_{CC}^+$. According to the known operation of the module 20, the transistor 1 is then in an off state. According to the operation in current mirror mode of the module 60, a current equal to I flows between the emitter and the collector of the transistor 62. Consequently, a current I flows from the node B towards the base of the transistor 3. Therefore:

$$i3 = \beta 3 \times I, \qquad (1)$$

where i3 is the current flowing through the transistor 3 from the collector to the emitter of the latter, and where □3 is the current gain of the transistor 3.

The output current of the circuit 100, denoted $i_{OUT}$, is then equal to i3−i4, where i4 is the current flowing through the transistor 4, from the emitter to the collector. The orientations of i3 and i4 are indicated in FIG. 1. i3 and i4 are positive. The value of $i_{OUT}$ is limited by the value of i3 given by equation (1). This value is frequently denoted by $I_{SOURCE}$. It is reached when the input electric potential Vp is higher than the input electric potential Vn, and when the value of the impedance 101 is sufficiently low.

Symmetrically, when the input electric potential Vp is lower than the input electric potential Vn, the electric potential of the node A is negative. The current $i_{OUT}$ is then negative and limited, in absolute value, by the value of i4 given by the equation (2):

$$i4 = \beta 4 \times I, \qquad (2)$$

where β4 is the current gain of the transistor 4. This value is frequently denoted by $I_{SINK}$. $I_{SINK}$ thus defined is a positive value.

When the electric potential $V_A$ reaches a sufficiently high value, the transistor 62 is in a saturated state. The maximum value that the electric potential $V_D$ can reach at the node D is then $V_{CC}^+ - V_{oh}$, with:

$$V_{oh} = U_{BE}(3) + U_{EC\ sat}(62) + R \times I, \qquad (3)$$

where $U_{BE}(3)$ is the difference between the electric potentials of the base and of the emitter of the transistor 3, and where $U_{EC\ sat}(62)$ is the difference between the electric potentials of the emitter and of the collector of the transistor 62 in the saturated state. $V_{oh}$ is called the drop-out voltage and can reach 1 volt. In the following description, the potential $V_D$ is called the output electric potential of the circuit 100.

A drop-out voltage $V_{ol}$, similar to $V_{oh}$, limits the value that the potential $V_D$ can take when Vp–Vn is negative. The minimum value of $V_D$ is then $V_{CC}^- + V_{ol}$. The voltage $V_{ol}$ obeys the expression:

$$V_{ol} = U_{EB}(4) + U_{CE\ sat}(72) + R \times I, \qquad (4)$$

where $U_{EB}(4)$ is the difference between the electric potentials of the emitter and of the base of the transistor 4, and where $U_{CE\ sat}(72)$ is the difference between the electric potentials of the collector and of the emitter of the transistor 72 in the saturated state. $V_{ol}$ can also reach 1 volt.

Furthermore, the respective emitters and bases of the transistors 1 to 4 form a closed loop. The difference between the electric potentials $V_A$ and $V_D$ is therefore given by the following double equation:

$$V_A - V_D = U_{BE}(1) + U_{BE}(3) = U_{BE}(2) + U_{BE}(4), \qquad (5)$$

where $U_{BE}(j)$ denotes the electric potential between the base and the emitter of the transistor j, for j=1, 2, 3 or 4.

In the idle state of the circuit 100, in other words when Vp=Vn, no current flows out of the node D in the direction of the impedance 101 ($i_{OUT}=0$), and the electric potentials of the nodes A and D are equal to each other. The currents flowing, respectively, between the node B and the base of the transistor 3, and between the node C and the base of the transistor 4 are very low compared to the current I. A current i1 equal to I therefore flows in the transistor 1, from the emitter to the collector of the transistor 1. Similarly, a current i2 equal to I flows in the transistor 2, from the collector to the emitter of the transistor 2. It therefore follows from equation (5) that i3=i4=n×I, where n is the ratio of the respective emitter areas of the transistors 3 and 2, or of the transistors 4 and 1:

$$n = \frac{\text{emitter area of transistor 3}}{\text{emitter area of transistor 2}} = \frac{\text{emitter area of transistor 4}}{\text{emitter area of transistor 1}} \qquad (6)$$

For example, n can be in the range 1 to 10.

In the idle state of the circuit 100, the total current drawn by the circuit 100, denoted $I_{CONS}$, is the current flowing between the power supply terminals 5 and 6. It is equal to the sum of the currents flowing respectively in the resistors 63 and 64, of i2 and of i3. Therefore:

$$I_{CONS} = (3+n) \times I. \qquad (7)$$

It is desirable to reduce this value of the total current drawn by a power amplification circuit in the idle state.

SUMMARY OF THE INVENTION

To address the above-discussed deficiencies of the prior art, one aim of the present invention thus consists in proposing a novel power amplification circuit that has a reduced current consumption in the idle state, for identical values of $I_{SOURCE}$ and $I_{SINK}$.

A subject of the invention is therefore a power amplification circuit that comprises:

an input and an output;

a first circuit module comprising a first and a second transistor of a same first type and each having a first and a second main electrode and a control electrode, said first main electrodes of said first and second transistors being respectively connected to a first voltage supply terminal via first and second substantially identical resistors, the respective control electrodes of said first and second transistors being connected to each other, the control electrode of said first transistor being also connected to the second main electrode of said first transistor;

a second circuit module comprising a third and a fourth transistor of a same second type opposite to the first type and each having a first and a second main electrode and a control electrode, said first main electrodes of said third and fourth transistors being respectively connected to a second voltage supply terminal by third and fourth substantially identical resistors, the respective control electrodes of said third and fourth transistors being connected to each other, the control electrode of said third transistor also being connected to the second main electrode of said third transistor;

a current source connected to said second main electrodes of the first and third transistors;

a push-pull module comprising:

a first and a second intermediate transistor, respectively of the first and second types, each having a first and a second main electrode and a control electrode, the two control electrodes of the first and second intermediate transistors being connected to each other and to the input of the circuit, the first main electrodes of the first and second intermediate transistors being respectively connected to the respective second main electrodes of said second and fourth transistors, at a first and a second node, respectively;

a first and a second output transistor, respectively of the second and first types, each having a first and a second main electrode and a control electrode, the control electrodes of said first and second output transistors being respectively connected to said first and second nodes, said first main electrodes of the first and second output transistors being connected to each other and to the output of the circuit, said second main electrodes of the first and second output transistors being respectively connected to said first and second voltage supply terminals.

The power amplification circuit also comprises:

a third circuit module having a first and a second input connected respectively to the second main electrode of said first intermediate transistor and to the first main electrode of said second transistor, and arranged such that an electric current flowing into said second input is identical to an electric current flowing into said first input, and a fourth circuit module having a first and a second output respectively connected to the second main electrode of said second intermediate transistor and to the first main electrode of said fourth transistor, and arranged such that an electric current flowing from said second output is identical to an electric current flowing from said first output.

Thus, a part of the current flowing in the second resistor of the first circuit module is sent into said third circuit module operating in current mirror mode. The current that flows through the second transistor of the first circuit module is therefore reduced, as is the current flowing through said first intermediate transistor. This reduction leads to a reduction in the current flowing between the main electrodes of the first output transistor. This results in a reduction of the total current drawn by the circuit between the two voltage supply terminals.

In a symmetrical fashion, a part of the current flowing in said fourth resistor of the second circuit module originates from said fourth circuit module operating in current mirror mode. This results in reductions in the currents flowing between the main electrodes of said fourth transistor and of said second intermediate transistor, and consequently also a reduction in the current flowing between the main electrodes of the second output transistor.

Furthermore, the maximum absolute value of the output current of such a circuit is identical to that of a circuit according to FIG. 1.

In addition, such a circuit has drop-out voltages substantially equal to those of a circuit according to FIG. 1.

The dynamic range of the output current and of the output electric potential of the circuit are therefore not reduced.

Lastly, this circuit is especially simple and robust. It is therefore inexpensive to produce and has a long operational lifetime.

In the preferred embodiment, said third circuit module comprises a fifth and a sixth transistor of said second type, each having a first and a second main electrode and a control electrode. Said first main electrodes of said fifth and sixth transistors are respectively connected to the second voltage supply terminal via fifth and sixth substantially identical resistors. The respective control electrodes of said fifth and sixth transistors are connected to each other, and the control electrode of said fifth transistor is also connected to the second main electrode of said fifth transistor. Said second main electrodes of said fifth and sixth transistors respectively comprise said first and second inputs of said third circuit module.

Similarly, said fourth circuit module can comprise a seventh and an eighth transistor of said first type, each having a first and a second main electrode and a control electrode. Said first main electrodes of said seventh and eighth transistors are respectively connected to the first voltage supply terminal via seventh and eighth substantially identical resistors. The respective control electrodes of said seventh and eighth transistors are connected to each other, and the control electrode of said seventh transistor is also connected to the second main electrode of said seventh transistor. Said second main electrodes of said seventh and eighth transistors respectively comprise said first and second outputs of said fourth circuit module.

Advantageously, at least some of the transistors of the power amplification circuit are bipolar transistors.

Another subject of the invention is an operational amplifier comprising a power amplification circuit such as is described above, said circuit forming a power output stage of said operational amplifier. Such an operational amplifier has a reduced total current consumption and is capable of delivering an identical output current.

Before undertaking the DETAILED DESCRIPTION OF The INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, interleave, juxtapose, be proximate to, be bound to or with, have, have a property of, or the like. Definitions for certain words and phrases are provided throughout this patent document,those of ordinary skill in the art should understand that in many, if not most instances, such definitions apply to prior, as well as future uses of such defined words and phrases.

BRIEF DESCRIPTION OF THE DRAWINGS

Other features and advantages of the present invention will become apparent in the following description of a non-limiting exemplary embodiment, making reference to the appended drawings, in which like reference numerals represent like parts, and in which.

Identical references used in several figures correspond to elements that are identical or that have analogous functions.

DETAILED DESCRIPTION OF THE INVENTION

FIGS. 2 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged power amplification circuit or an operational amplifier incorporating such a circuit.

Figure 2:
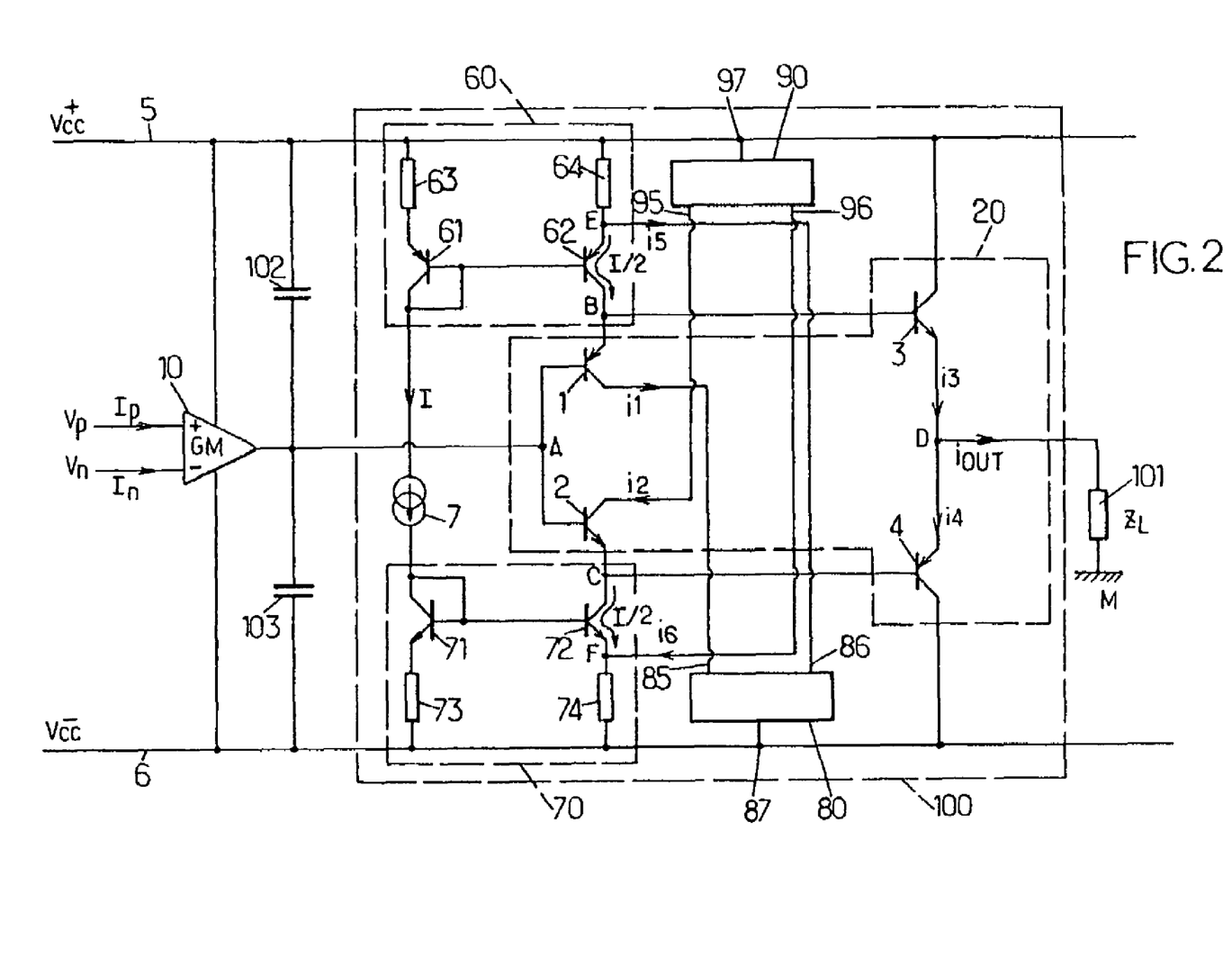
FIG. 2 is a circuit diagram of an operational amplifier comprising a power amplification circuit according to the invention.

An operational amplifier according to FIG. 2 comprises components that are identical to those in an operational amplifier according to FIG. 1, configured in the same manner. The description of these common components is not repeated here and reference will be made to the description of FIG. 1 above.

According to the circuit diagram in FIG. 2, in the circuit 100 according to the invention, the connection between the collector of the intermediate transistor 1 and the voltage supply terminal 6, together with the connection between the collector of the intermediate transistor 2 and the voltage supply terminal 5, are eliminated. These are replaced by two additional circuit modules 80 and 90.

The module 80 is connected to the voltage supply terminal 6 at a node 87. It is recalled that the electric potential of the voltage supply terminal 6 is lower than that of the voltage supply terminal 5. The module 80 has an input 85 connected to the collector of the intermediate transistor 1, and an input 86 connected to the emitter of the transistor 62 at a node E. The module 80 is configured such that an electric current i5 flowing between the node E and the input 86 is identical to an electric current i1 flowing from the collector of the transistor 1. In other words, i5=i1 and the module 80 operates in current mirror mode. The flow direction conventions adopted for the currents i1 and i5 are indicated in FIG. 2.

Figure 3A:
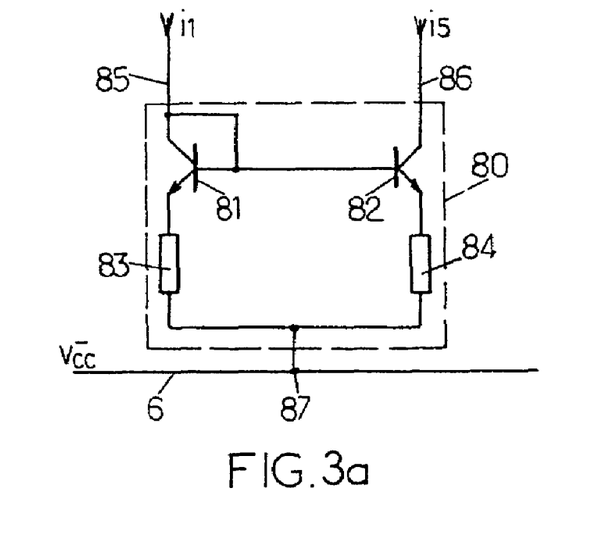
FIGS. 3a and 3b are circuit diagrams of two circuit modules that can be employed in an operational amplifier according to FIG. 2.

FIG. 3a is a circuit diagram of circuit module that can be employed for the module 80. This circuit module is of the Widlar current source type with inflowing currents. It comprises two npn-type bipolar transistors 81 and 82. The emitters of the transistors 81 and 82 are connected to the voltage supply terminal 6 via substantially identical resistors 83 and 84, respectively. The respective bases of the transistors 81 and 82 are connected to each other, and also to the collector of the transistor 81. The transistors 81 and 82 are preferably identical to each other. The resistors 83 and 84 can have a value of 1 kilo-ohm, for example.

The module 90 is connected to the voltage supply terminal 5 at a node 97. The module 90 has an output 95 connected to the collector of the intermediate transistor 2, and an output 96 connected to the emitter of the transistor 72 at a node F. The module 90 is configured such that an electric current i6 flowing between the output 96 and the node F is identical to an electric current i2 flowing into the collector of the transistor 2. In other words, i6=i2 and the module 90 also operates in current mirror mode. The flow direction conventions adopted for the currents i2 and i6 are indicated in FIG. 2.

Figure 3B:
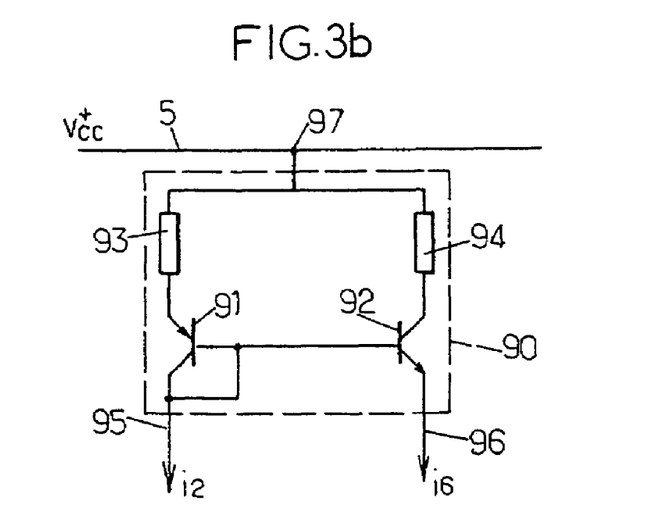

FIG. 3b is a circuit diagram of another circuit module that can be employed for the module 90. This other circuit module is of the Widlar current source type with outflowing currents. The bipolar transistors 91 and 92 are of the pnp type and are preferably identical to each other. The emitters of the transistors 91 and 92 are respectively connected to the voltage supply terminal 5 via substantially identical resistors 93 and 94. The respective bases of the transistors 91 and 92 are connected to each other, and also to the collector of the transistor 91. The resistors 93 and 94 can also have a value of 1 kilo-ohm, for example.

The consequence of the addition of the nodes E and F in the modules 60 and 70, respectively, is that these modules no longer operate as current mirrors. In the idle state of the circuit 100, the current flowing between the node B and the base of the transistor 3 is negligible compared with the current flowing into the emitter of the transistor 1. The current flowing in the resistor 64 is then 2×i5. The relationship between the voltages within the loop formed by the resistor 63, the transistors 61 and 62, and the resistor 64 is then:

$$R \times I + U_{EB}(61) = R \times 2 \times i5 + U_{EB}(62), \quad (8)$$

where $U_{EB}(61)$ and $U_{EB}(62)$ represent the electric potential difference between the emitter and the base for the transistors 61 and 62, respectively. Consequently:

$$i5 = \frac{I}{2} + \frac{\Delta U_{EB}}{2 \times R},$$

where $\Delta U_{EB} = U_{EB}(61) - U_{EB}(62)$. (9)

Taking the numerical values of these variables leads to:

$$\left| \frac{\Delta U_{EB}}{2 \times R} \right| << \frac{I}{2}, \quad (10)$$

where | |denotes the absolute value. Consequently, i5 is approximately equal to I/2. From this, it follows that the current flowing through the transistor 62 in the idle state (i.e. when Vp=Vn) is also approximately equal to I/2. The current flowing through the transistor 62 is therefore approximately equal to half of the corresponding current in the case of a circuit according to FIG. 1.

An analogous reasoning to that which has just been presented, applied to the module 70 and to the transistor 2, leads to i2=i6≈I/2.

The total current $I_{CONS}$ drawn by a circuit 100 according to FIG. 2, in the idle state (i.e. when Vp=Vn), between the voltage supply terminals 5 and 6, is the sum of:

the current flowing in the resistor 63, in other words I, the current flowing in the resistor 64, the current flowing into the module 90 from the node 97, and the current flowing between the collector and the emitter of the transistor 3.

According to the node E, the current flowing in the resistor 64 is approximately equal to 2×I/2, in other words I. According to the values determined above for the currents i2 and i6, the current flowing into the module 90 from the node 97 is i2+i6≈2×I/2≈I. Furthermore, according to the equation (5) still valid for a circuit 100 according to FIG. 2, and taking into account that in the idle state $V_A = V_D$, the result is that $U_{BE}(3) = -U_{BE}(1)$, and therefore that i3=n×I/2. Consequently:

$$I_{CONS} = 3 \times I + n \times I/2 = (3 + n/2) \times I. \quad (11)$$

n again denotes the ratio of the emitter areas of the transistors 3 and 2, which is equal to the ratio of the emitter areas of the transistors 4 and 1. For a given value of n, the total current drawn by a circuit 100 according to FIG. 2 is therefore lower by n×I/2 with respect to that of a circuit 100 according to FIG. 1, when a comparison is made between the equations (7) and (11).

Table 1 below indicates the values of $I_{CONS}$ for different values of n, for two circuits according to FIG. 1 and to FIG. 2, respectively. Table 1 also indicates the relative gain in total current consumption for a circuit according to FIG. 2 relative to a circuit according to FIG. 1:

TABLE 1

| n | $I_{CONS}$ (FIG. 1) | $I_{CONS}$ (FIG. 2) | Gain = $\frac{\Delta I_{CONS}}{I_{CONS}(\text{FIG. 1})}$ |
|---|---|---|---|
| 1 | 4 × I | 3.5 × I | 13% |
| 2 | 5 × I | 4 × I | 20% |
| 5 | 8 × I | 5.5 × I | 31% |
| 10 | 13 × I | 8 × I | 38% |

The expressions for $I_{SOURCE}$ and for $I_{SINK}$ given by the equations (1) and (2) are still valid for a circuit 100 according to FIG. 2. The maximum absolute value of the current $i_{OUT}$ is therefore the same for two circuits 100 according to FIGS. 1 and 2, respectively.

Similarly, the equations (3) and (4) giving the expressions for the drop-out voltages $V_{oh}$ and $V_{ol}$ are still valid for a circuit 100 according to FIG. 2.

The characteristics of a circuit 100 according to FIG. 2 are now compared with those of a circuit 100 according to FIG. 1. In order to carry out this comparison, the current I of the source 7 of the circuit 100 according to FIG. 2 is adjusted such that the two circuits exhibit identical values of total current drawn $I_{CONS}$. For this purpose, the current I for the circuit 100 according to FIG. 2 is increased so as to compensate for the gain indicated in the last column of Table 1, for example for n=10. All the components present in each of the two circuits considered, which correspond to the same references in FIGS. 1 and 2, have identical values aside from the value I for the current source 7.

Figure 4A:
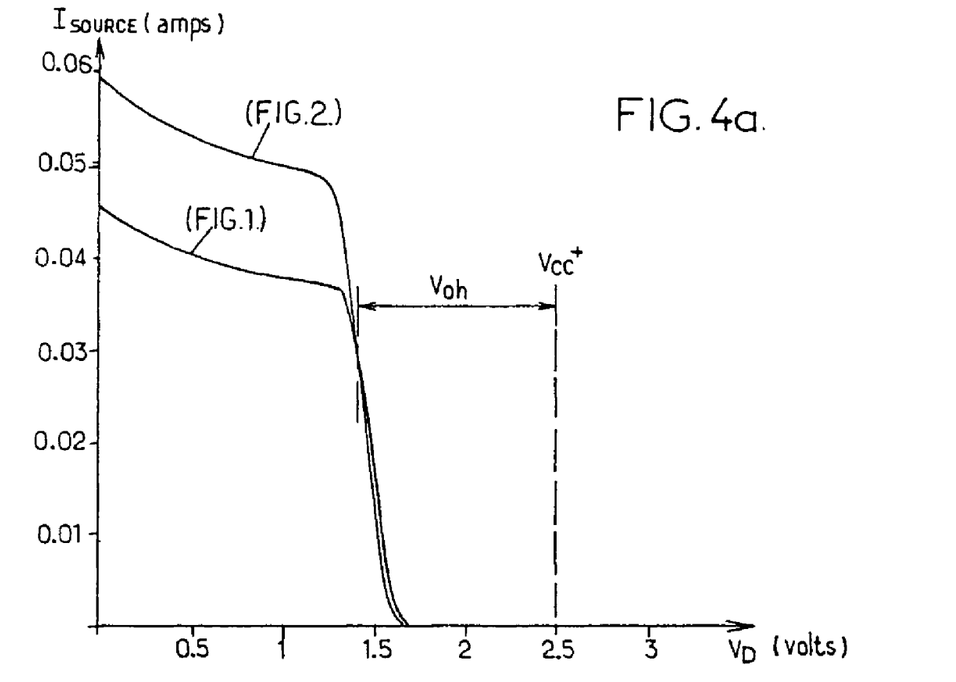
FIGS. 4a and 4b show variations in the maximum output current, in absolute value, for two circuits according, respectively, to FIG. 1 and to FIG. 2.

FIG. 4a illustrates the variations of $I_{SOURCE}$ as a function of the electric potential of the node D when the difference Vp−Vn is positive, for each of the two circuits considered. These are therefore output characteristic curves, in voltage-current coordinates, respectively for a circuit 100 according to FIG. 1 and for a circuit 100 according to FIG. 2. Each of these characteristic curves is of the current-generator type that comprises a plateau up to a maximum value of the electric potential of the node D, fixed by the drop-out voltage $V_{oh}$. The value of $I_{SOURCE}$ in this plateau region is around 0.038 amps, for a circuit 100 according to FIG. 1, and around 0.051 amps for a circuit 100 according to FIG. 2. The increase in the value of $I_{SOURCE}$ obtained is therefore around 34%. The slope of each curve in the plateau region is linked to a residual variation in the electric potentials of the electrodes of the transistors 1 and 62.

These curves show, in addition, that the drop-out voltage $V_{oh}$ has substantially the same value for the two circuits according to FIG. 1 and to FIG. 2, respectively. Indeed, the plateaus corresponding to each of the two circuits have identical lengths.

Figure 4B:
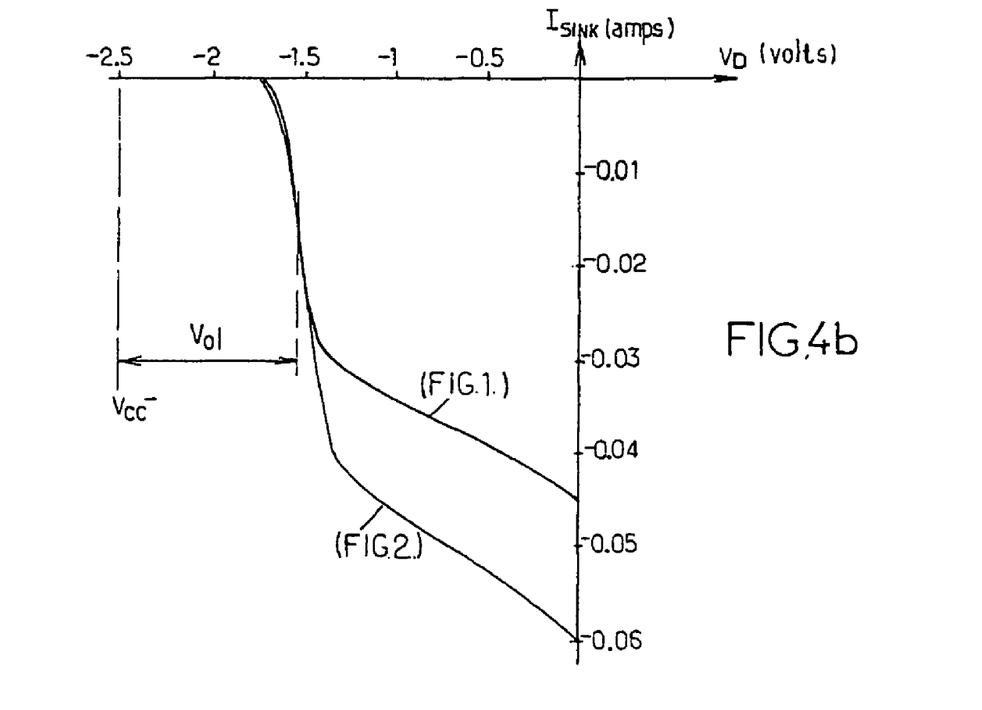

FIG. 4b is analogous to FIG. 4a, but when Vp−Vn is negative. It indicates the minimum values of the current $i_{OUT}$ (these minimum values being negative) and therefore corresponds to $-I_{SINK}$.

Preferably, when one of the circuit modules 80 or 90 is in the form of an integrated circuit on the surface of a substrate S, at least one of the transistors of this module has a vertical configuration. According to such a configuration, one main conduction direction of the transistor is substantially perpendicular to a surface of the substrate.

Figure 5:
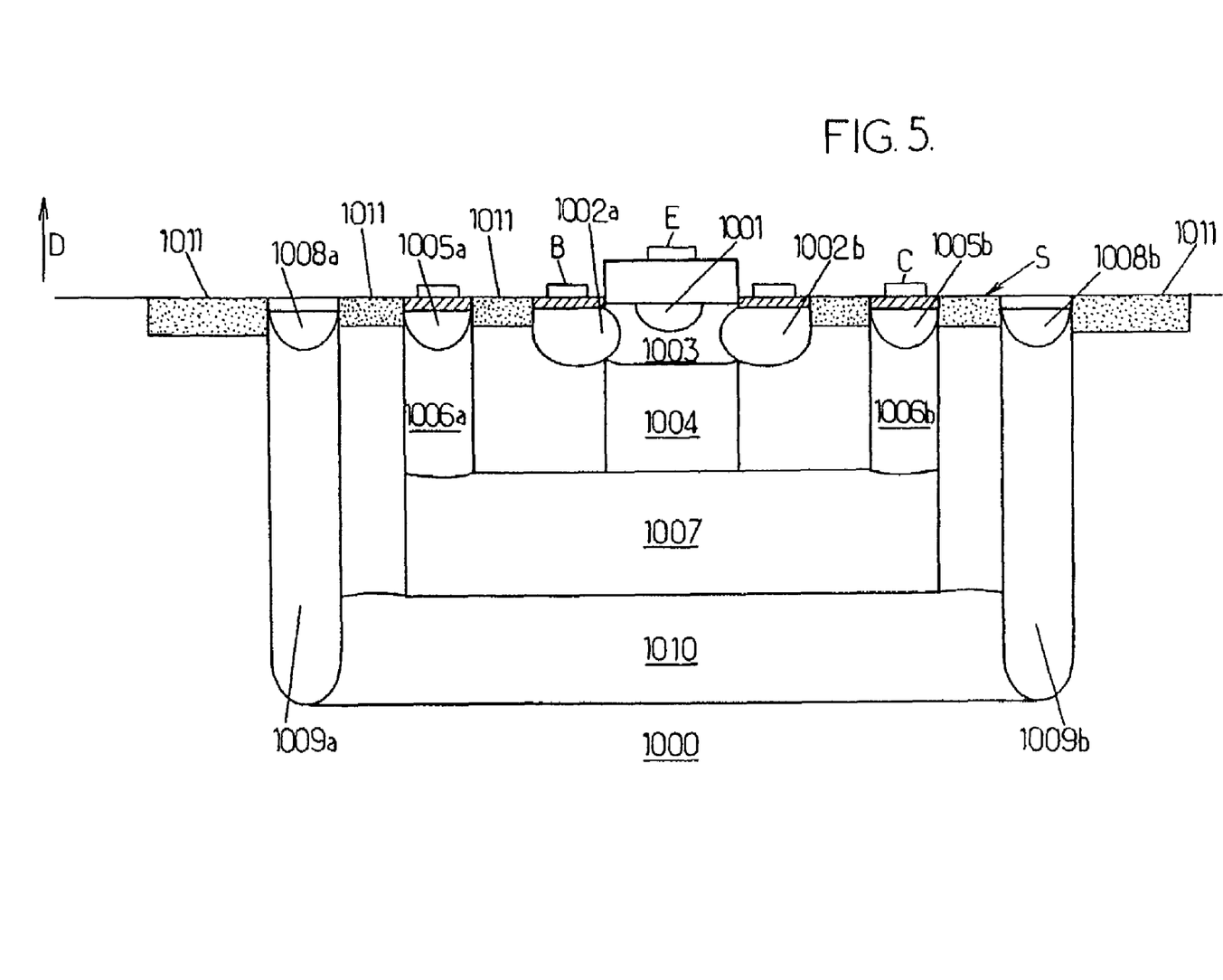
FIG. 5 illustrates a preferred configuration of transistors that can be employed for a circuit module according to FIG. 3b.

FIG. 5 shows a bipolar pnp-type transistor having a vertical configuration. The direction D, oriented towards the top of the figure, is substantially perpendicular to a surface S of a substrate 1000. The substrate 1000 is of the p type. Several doped regions are layered within the substrate 1000 under the surface S, in the direction D. A $p^+$-type region 1001 forms the emitter region of the transistor, an n type region 1003 forms the channel of the transistor, an intermediate region 1004 is of the p type, and a region 1007, also of the p type and called the buried region, forms the collector of the transistor. A current flowing from the emitter to the collector of the transistor crosses the regions 1001, 1003, 1004 and 1007: hence it flows parallel to the direction D. Lastly, a deep region 1010 is n-doped.

An emitter contact region E is disposed above the region 1001 and in electrical contact with it.

The region 1003 is contiguous with base contact regions B referenced 1002a and 1002b. The contact regions 1002a and 1002b are disposed at the surface S, on either side of the region 1003 and are $n^+$-doped.

The region 1007 is connected to collector contact regions 1005a and 1005b via electrical connection regions 1006a and 1006b. The contact regions 1005a and 1005b are disposed at the surface S and are $p^+$-doped. The electrical connection regions 1006a and 1006b are formed by p-wells.

Lastly, the deep region 1010 separates the transistor from the rest of the volume of the substrate 1000. It is connected to contact regions 1008a and 1008b, disposed at the surface S, via electrical connection regions 1009a and 1009b. The contact regions 1008a and 1008b are $n^+$-doped and the electrical connection regions 1009a and 1009b are formed by n-wells. The region 1010 can thus be biased to a predetermined electric potential.

Electrical isolation regions 1011, for example made of silica, separate the various contact regions at the surface S.

A transistor with such a configuration occupies a reduced area of the surface S of the substrate 1000: it can be integrated to an especially high level. One dimension of the transistor taken parallel to the surface S of the substrate 1000 can be, for example, around 0.25 microns, as measured between the outer edges of two isolation regions 1011 at opposing ends of the transistor. The circuit module comprising such a transistor is therefore especially compact.

The configuration of a transistor illustrated by FIG. 5 is presented by way of an example. Other equivalent configurations, that afford equivalent possibilities for integration, can be employed.

The circuit modules corresponding to FIGS. 3a and 3b are also presented by way of examples. It will be understood that other circuits operating in current mirror mode and known to those skilled in the art can be used for the modules 80 and 90.

Finally, it will also be understood that a circuit according to the principle of the invention can be obtained by employing field effect transistors, notably those using MOS (Metal Oxide Semiconductor) technology. The substitution of each bipolar transistor described above by a field effect transistor can be effected according to the known rules of correspondence between the various types of bipolar transistor and the various types of field effect transistor. It is intended that the present invention encompass such changes and modifications as fall within the scope of the appended claims.

What is claimed is:

1. A power amplification circuit comprising:
   an input and an output;
   a first circuit module comprising a first and a second transistor of a same first type and each having a first and a second main electrode and a control electrode, said first main electrodes of said first and second transistors being respectively connected to a first voltage supply terminal via first and second substantially identical resistors, the respective control electrodes of said first and second transistors being connected to each other, the control electrode of said first transistor being also connected to the second main electrode of said first transistor;

a second circuit module comprising a third and a fourth transistor of a same second type opposite to the first type and each having a first and a second main electrode and a control electrode, said first main electrodes of said third and fourth transistors being respectively connected to a second voltage supply terminal by third and fourth substantially identical resistors, the respective control electrodes of said third and fourth transistors being connected to each other, the control electrode of said third transistor also being connected to the second main electrode of said third transistor;

a current source connected to said second main electrodes of the first and third transistors;

a push-pull module, wherein the push-pull module further comprises:

a first and a second intermediate transistor, respectively of the first and second types, each having a first and a second main electrode and a control electrode, the two control electrodes of the first and second intermediate transistors being connected to each other and to the input of the circuit, the first main electrodes of the first and second intermediate transistors being respectively connected to the respective second main electrodes of second and fourth transistors, by a first and a second node, respectively; and a first and a second output transistor, respectively of the second and first types, each having a first and a second main electrode and a control electrode, the control electrodes of said first and second output transistors being respectively connected to said first and second nodes, said first main electrodes of the first and second output transistors being connected to each other and to the output of the circuit, said second main electrodes of the first and second output transistors being respectively connected to said first and second voltage supply terminals, a third circuit module having a first and a second input connected respectively to the second main electrode of said first intermediate transistor and to the first main electrode of said second transistor, and arranged such that an electric current flowing into said second input is identical to an electric current flowing into said first input, and a fourth circuit module having a first and a second output respectively connected to the second main electrode of said second intermediate transistor and to the first main electrode of said fourth transistor, and arranged such that an electric current flowing from said second output is identical to an electric current flowing from said first output.

2. The power amplification circuit of claim 1, wherein said third circuit module comprises a fifth and a sixth transistor of said second type, each having a first and a second main electrode and a control electrode, said first main electrodes of said fifth and sixth transistors being respectively connected to the second voltage supply terminal via fifth and sixth substantially identical resistors, the respective control electrodes of said fifth and sixth transistors being connected to each other, the control electrode of said fifth transistor also being connected to the second main electrode of said fifth transistor, said second main electrodes of said fifth and sixth transistors respectively comprising said first and second inputs of said third circuit module.

3. The power amplification circuit of claim 1, wherein said fourth circuit module comprises a seventh and an eighth transistor of said first type, each having a first and a second main electrode and a control electrode, said first main electrodes of said seventh and eighth transistors being respectively connected to the first voltage supply terminal via seventh and eighth substantially identical resistors, the respective control electrodes of said seventh and eighth transistors being connected to each other, the control electrode of said seventh transistor also being connected to the second main electrode of said seventh transistor, said second main electrodes of said seventh and eighth transistors respectively comprising said first and second outputs of said fourth circuit module.

4. The power amplification circuit of claim 1, wherein at least some of the transistors of said circuit are bipolar transistors.

5. The power amplification circuit of claim 1, wherein at least one transistor of said third or fourth circuit modules has a main conduction direction substantially perpendicular to a surface of a substrate of said circuit module.

6. An operational amplifier comprising a power amplification circuit according to claim 1, said circuit forming a power output stage of said operational amplifier.

7. The power amplification circuit of claim 1, wherein said third circuit module is a Widlar current source.

8. The power amplification circuit of claim 1, wherein said second module is a Widlar current source with outflowing currents.

9. A power output stage of an operational amplifier comprising:

a first circuit;

a second circuit;

a current source coupled to a first output of the first circuit and a first input of the second circuit;

a push-pull module coupled to a second output of said first circuit and a second input of the second circuit, wherein said push-pull module comprises a first intermediate transistor, a second intermediate transistor and two output transistors; and a first current mirror having a first module, a second module, a first input coupled to a main electrode of said first intermediate transistor and a second input coupled to said first circuit, wherein a first output of said current mirror is coupled to a main electrode of said second intermediate transistor and a second output of said current mirror is further coupled to said second circuit.

10. The power output stage of claim 9, wherein said first module comprises a third transistor and a fourth transistor, each having a first and a second main electrode and a control electrode, said first main electrodes of said third and fourth transistors being respectively connected to a voltage supply terminal via substantially identical resistors, the respective control electrodes of said third and forth transistors being connected to each other, the control electrode of said third transistor also being connected to the second main electrode of said third transistor, said second main electrodes of said third and fourth transistors respectively comprising said first input and said second input of said current mirror.

11. The power amplification circuit of claim 9, wherein said second module comprises a fifth and a sixth transistor of said second type, each having a first and a second main electrode and a control electrode, said first main electrodes of said fifth and sixth transistors being respectively connected to the first voltage supply terminal via said fifth and sixth substantially identical resistors, the respective control electrodes of said fifth and sixth transistors being connected to each other, the control electrode of said fifth transistor also being connected to the second main electrode of said fifth transistor, said second main electrodes of said fifth and sixth transistors respectively comprising said first and second outputs of said fourth module.

12. The power output stage of claim 9, wherein at least one of said transistors is a bipolar transistors.

13. The power output stage of claim 9, wherein at least one transistor of said current mirror has a main conduction direction substantially perpendicular to a surface of a substrate of said first and second circuits.

14. The power output stage of claim 9, wherein said second module is a Widlar current source.

15. The power output stage of claim 9, wherein said second module is a Widlar current source with outflowing currents.

16. A power output stage of an operational amplifier comprising:
   a first circuit;
   a second circuit;
   a current source coupled to a first output of said first circuit and a first input of the second circuit;
   a push-pull module coupled to a second output of the first circuit and a second input of said second circuit, wherein said push-pull module comprises a first intermediate transistor, a second intermediate transistor and two output transistors; and
   a first current mirror having a first module, a Widlar current source, and a first and a second input coupled to a main electrode of said first intermediate transistor and is further coupled to said first circuit, wherein a first output of the current mirror is coupled to a main electrode of said second intermediate transistor and is further coupled to said second circuit.

17. The power output stage of claim 16, wherein said first module comprises a third transistor and a fourth transistor, each having a first and a second main electrode and a control electrode, said first main electrodes of said third and fourth transistors being respectively connected to a voltage supply terminal via substantially identical resistors, the respective control electrodes of said third and fourth transistors being connected to each other, the control electrode of said third transistor also being connected to the second main electrode of said third transistor, said second main electrodes of said third and fourth transistors respectively forming said first and second inputs of said current mirror.

18. The power output stage of claim 16, wherein at least some of said transistors are bipolar transistors.

19. The power output stage of claim 16, wherein at least one transistor of said current mirror has a main conduction direction substantially perpendicular to a surface of a substrate of said circuit module.

20. The power output stage of claim 16, wherein said Widlar current source comprises outflowing currents.

* * * * *